United States Patent
Kotani et al.

(10) Patent No.: US 11,095,800 B2
(45) Date of Patent: Aug. 17, 2021

(54) IMAGING UNIT AND COMPONENT MOUNTING MACHINE

(71) Applicant: FUJI CORPORATION, Chiryu (JP)

(72) Inventors: Kazuya Kotani, Toyota (JP); Hidenori Goto, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/766,941

(22) PCT Filed: Dec. 5, 2017

(86) PCT No.: PCT/JP2017/043701
§ 371 (c)(1),
(2) Date: May 26, 2020

(87) PCT Pub. No.: WO2019/111331
PCT Pub. Date: Jun. 13, 2019

(65) Prior Publication Data
US 2020/0348582 A1  Nov. 5, 2020

(51) Int. Cl.
*H04N 5/225* (2006.01)
*G03B 15/05* (2021.01)
*H04N 5/232* (2006.01)

(52) U.S. Cl.
CPC ........... *H04N 5/2256* (2013.01); *G03B 15/05* (2013.01); *H04N 5/23229* (2013.01); *G03B 2215/056* (2013.01); *G03B 2215/0517* (2013.01)

(58) Field of Classification Search
CPC .................................................... G03B 33/08
See application file for complete search history.

(56) References Cited

U.S. PATENT DOCUMENTS

| | | | |
|---|---|---|---|
| 7,486,329 B2 * | 2/2009 | Endo | G02B 21/245 348/345 |
| 8,917,900 B2 * | 12/2014 | Kanetani | G01B 11/0608 382/100 |
| 2003/0169418 A1 * | 9/2003 | Fujii | G01N 21/95684 356/237.2 |
| 2016/0227683 A1 * | 8/2016 | Nakajima | H05K 13/08 |

FOREIGN PATENT DOCUMENTS

FR      2826461 A1 * 12/2002  ......... G02B 21/0072
JP    2010-232548 A    10/2010

OTHER PUBLICATIONS

International Search Report dated Jan. 30, 2018 in PCT/JP2017/043701 filed Dec. 5, 2017.

* cited by examiner

*Primary Examiner* — Clayton E. LaBalle
*Assistant Examiner* — Leon W Rhodes, Jr.
(74) *Attorney, Agent, or Firm* — Oblon, McClelland, Maier & Neustadt, L.L.P.

(57) ABSTRACT

An imaging unit of the disclosure includes: a camera; a holding member configured to hold an imaging target object to be imaged by the camera; a light irradiation device configured to irradiate lights of different wavelengths from multiple light sources towards the imaging target object held by the holding member; and a control device configured to obtain a proper resolving power value for a light or lights of one or more light sources selected from the multiple light sources for use for imaging, irradiate the light or lights of the one or more light sources so selected onto the imaging target object to image the imaging target object using the camera, and make use of the proper resolving power value in processing an image obtained from the camera.

5 Claims, 6 Drawing Sheets

IMAGING UNIT AND COMPONENT MOUNTING MACHINE

TECHNICAL FIELD

This description discloses an imaging unit and a component mounting machine.

BACKGROUND ART

Conventionally, as a component mounting machine, there has been known a component mounting machine in which two types of lighting devices, which are configured to emit lights of different wavelengths, and a camera, which is configured to image an imaging target object irradiated by the lighting devices, are provided on a loading base, so that contrast values are calculated based on the different wavelengths, and focusing positions of visible lights of wavelengths, corresponding to the calculated contrast values, are obtained based on contrast curve characteristics which have been obtained in advance individually for the different wavelengths.

PATENT LITERATURE

Patent Literature 1: JP-A-2010-232548

BRIEF SUMMARY

Technical Problem

Incidentally, in the component mounting machine, in imaging the imaging target object irradiated by the two types of lighting devices configured to emit the lights of different wavelengths, although focal distances are the same, distances from an optical axis may differ from time to time due to an effect of chromatic aberration of magnification. Patent Literature 1 does not take the effect of chromatic aberration of magnification into consideration.

The disclosure has been made in view of the problem described above, and a main object thereof is to obtain highly accurate information from a captured image of an imaging target object by suppressing the effect of chromatic aberration.

Solution to Problem

According to one aspect of the disclosure, there is provided an imaging unit including: a camera; a holding member configured to hold an imaging target object to be imaged by the camera; a light irradiation device configured to irradiate lights of different wavelengths from multiple light sources towards the imaging target object held by the holding member; and a control device configured to obtain a proper resolving power value for a light or lights of one or more light sources selected from the multiple light sources for use for imaging, irradiate the light or lights of the one or more light sources so selected onto the imaging target object to image the imaging target object using the camera, and make use of the proper resolving power value in processing an image obtained from the camera.

In this imaging unit, the one or more light sources selected from the multiple light sources that emit the lights of difference wavelengths are used for imaging, and the proper resolving power value for the light or lights of the one or more light sources so selected is obtained. Then, the light or lights of the one or more light sources so selected are irradiated onto the imaging target object held by the holding member to image the imaging target object by a camera, and the proper resolving power value that has been previously obtained is used for processing an image obtained from the camera. The proper resolving power values differ in the light or lights of the one or more light sources selected from the multiple light sources that emit lights of different wavelengths (that is, differ in wavelengths of colors of irradiating lights) due to the effect of chromatic aberration of magnification. In this imaging unit, in processing the image obtained from the camera, the image is processed by making use of the proper resolving power value for the wavelength of the color of the irradiating light that irradiates the imaging target object. Therefore, the effect of chromatic aberration of magnification can be suppressed when processing the captured image of the imaging target object.

According to another aspect of the disclosure, there is provided an imaging unit including: a camera; a holding member configured to hold an imaging target object; a distance adjusting device configured to adjust a distance between the camera and the holding member; a light irradiation device configured to irradiate lights of different wavelengths from multiple light sources towards the imaging target object held by the holding member; and a control device configured to obtain a proper value for the distance for a light or lights of one or more light sources selected from the multiple light sources for use for imaging based on an image forming point on an optical axis which changes according to a longitudinal chromatic aberration and control the distance adjusting device so that the actual distance becomes the proper value for the distance.

In this imaging unit, the one or more light sources selected from the multiple light sources that emit the lights of different wavelengths are used for capturing an image. Further, the proper value for the distance between the camera and the holding member is obtained for the light or lights of the one or more light sources based on the image forming point on the optical axis which changes according to the longitudinal chromatic aberration. Then, distance control is performed so that the actual distance between the camera and the holding member becomes the proper value. Thereafter, the imaging target object is imaged by the camera. That is, the distance between the camera and the holding member for imaging the imaging target object is set at the proper value in consideration of the effect of the longitudinal chromatic aberration.

Therefore, the effect of the longitudinal chromatic aberration can be suppressed when processing the captured image of the imaging target object.

DESCRIPTION OF EMBODIMENT

Figure 1:
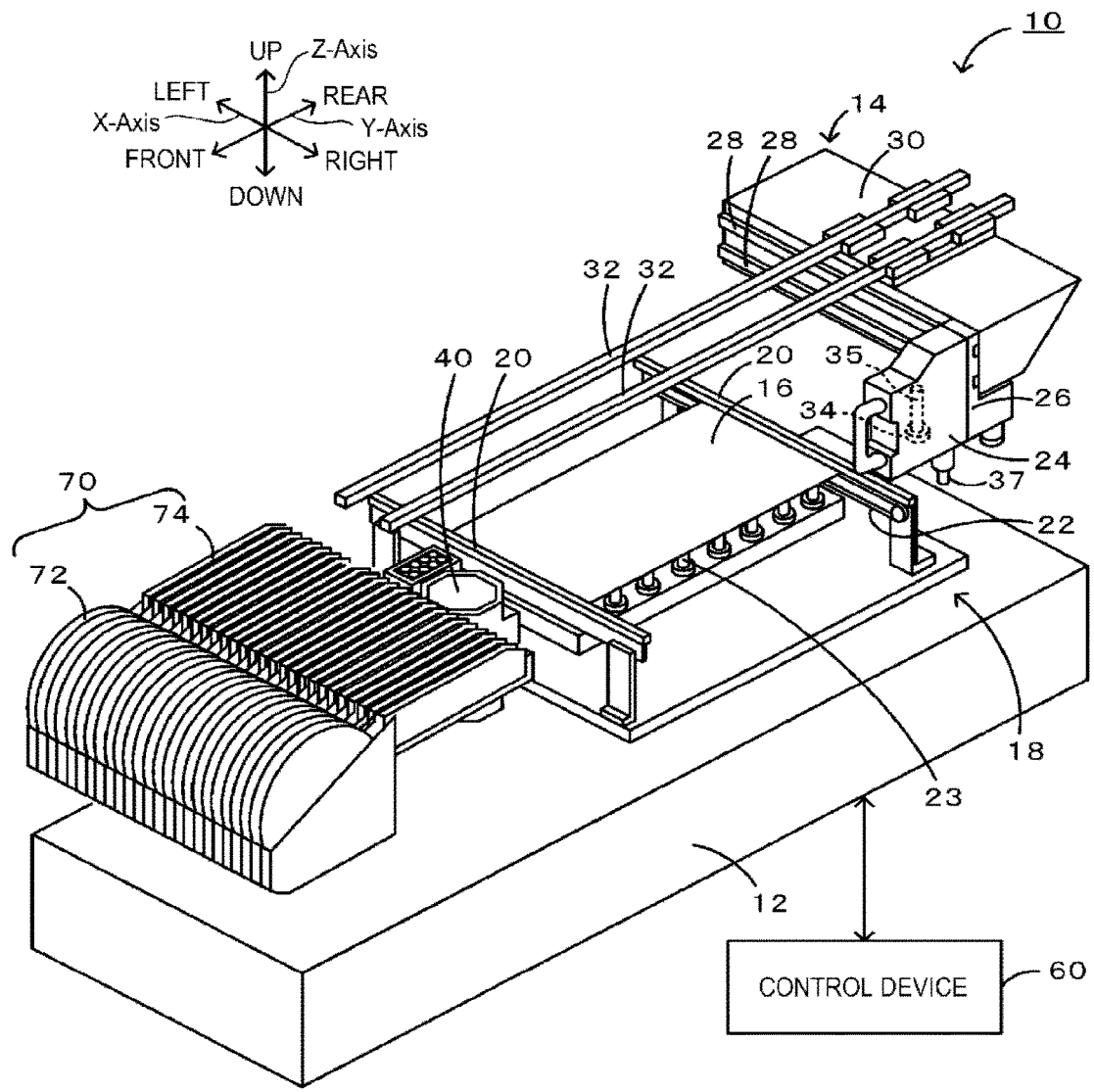
FIG. 1 is a perspective view of component mounting machine 10.
Figure 2:
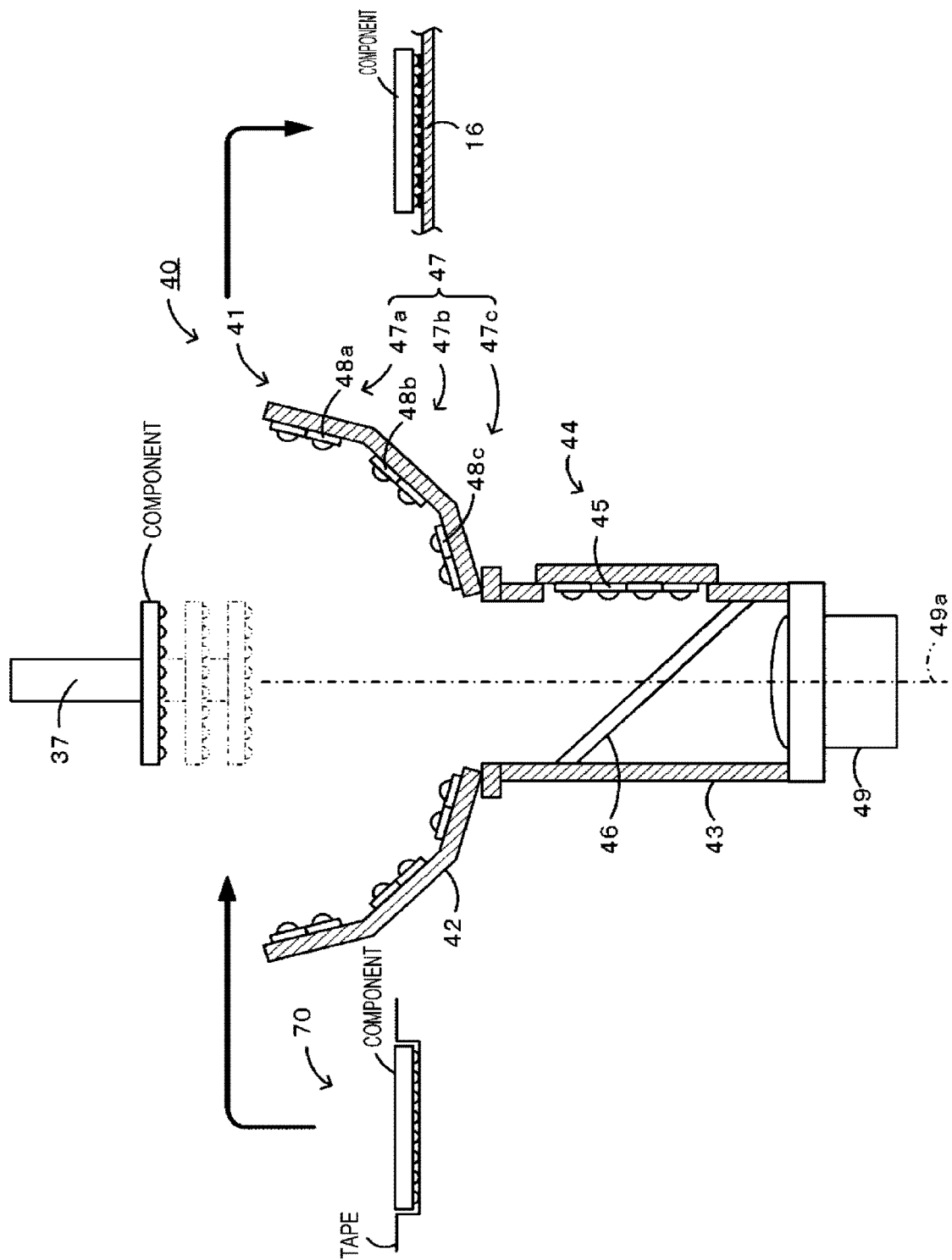
FIG. 2 is a schematic explanatory diagram of the configuration of part camera 40.
Figure 3:
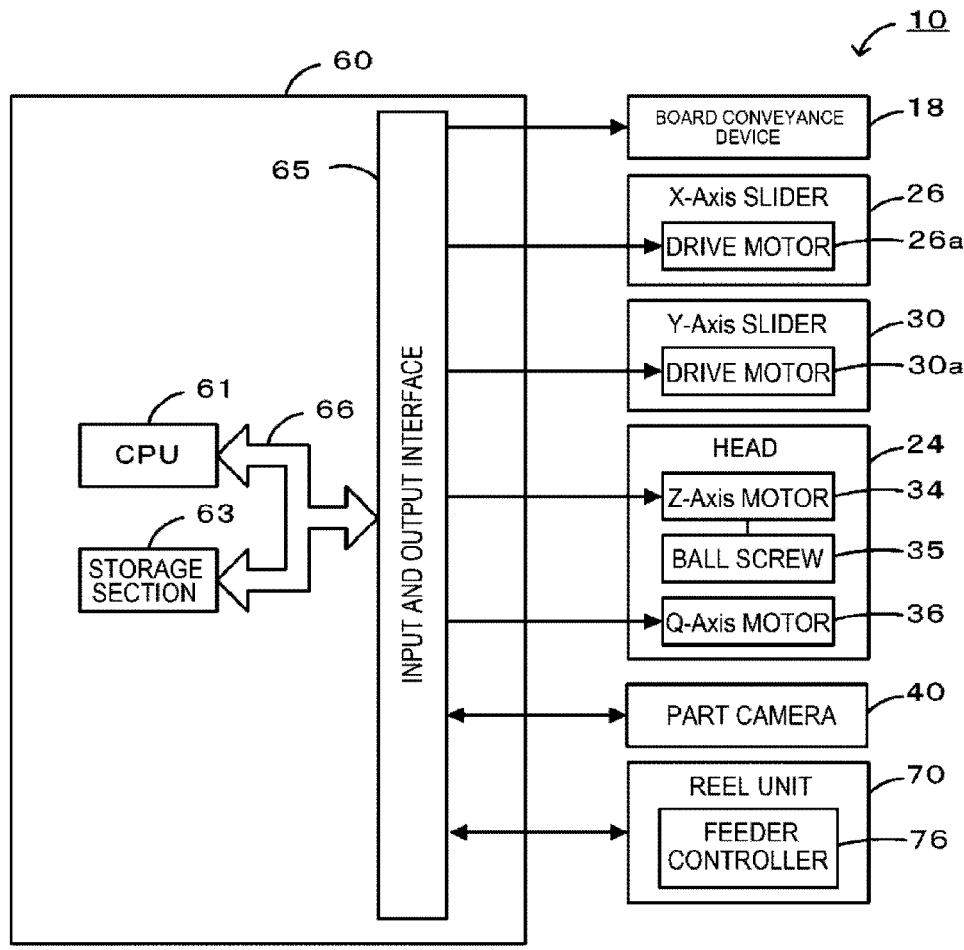
FIG. 3 is a block diagram showing a configuration relating to a control of component mounting machine 10.

Hereinafter, referring to drawings, a preferred embodiment of an image processing method and an image processing device according to the disclosure will be described. FIG. 1 is a perspective view of component mounting machine 10, FIG. 2 is a schematic explanatory diagram of the configuration of part camera 40, and FIG. 3 is a block diagram showing a configuration relating to a control of component mounting machine 10. In the embodiment, a left-right direction (an X-axis), a front-rear direction (a Y-axis), and a vertical direction (a Z-axis) are defined as shown in FIG. 1.

Component mounting machine 10 includes a loading base 12, mounting machine main body 14 installed on loading base 12, and reel unit 70 as a component supply device mounted on mounting machine main body 14.

mounting machine main body 14 is installed on loading base 12 in such a manner as to be exchanged for another. Mounting machine main body 14 includes board conveyance device 18, head 24, nozzle 37, part camera 40, and control device 60.

Board conveyance device 18 is a device for conveying and holding board 16. Board conveyance device 18 includes support plates 20, 20 and conveyor belts 22, 22 (only one of them is shown in FIG. 1). Support plates 20, 20 are members extending in a left-right direction and are provided apart from each other in a front-rear direction in FIG. 1. Each of conveyor belts 22, 22 is laid out to extend around a driving wheel and a driven wheel provided at a left end and a right end of a corresponding one of support plates 20, 20 endlessly. Board 16 is rested on upper surfaces of pair of conveyor belts 22, 22 and is conveyed from left to right. Board 16 can be supported by multiple support pins 23 from a rear surface side thereof. As a result, board conveyance device 18 also functions as a board supporting device.

Head 24 is attached to a front face of X-axis slider 26. X-axis slider 26 is attached to a front face of Y-axis slider 30. Y-axis slider 30 is slidably attached to pair of left and right guide rails 32, 32 extending in the front-rear direction. Pair of upper and lower guide rails 28, 28, which extend in the left-right direction, are provided on the front face of Y-axis slider 30. X-axis slider 26 is slidably attached to guide rails 28, 28. Head 24 moves in the left-right direction as X-axis slider 26 moves in the left-right direction and moves in the front-rear direction as Y-axis slider 30 moves in the front-rear direction. Incidentally, sliders 26, 30 are driven by drive motors 26a, 30a (see FIG. 3), respectively. Additionally, head 24 also incorporates Z-axis motor 34 and adjusts a height of nozzle 37 attached to ball screw 35 extending along the Z-axis using Z-axis motor 34. Further, head 24 incorporates Q-axis motor 36 (see FIG. 3) for rotating nozzle 37 around an axis thereof.

Nozzle 37 is a member for picking up a component with a nozzle tip and holding the component at the nozzle tip through suction and releasing the component held at the nozzle tip through suction from the held state. A pressure can be supplied to nozzle 37 from a pressure supply source, not shown, and nozzle 37 picks up a component through suction, for example, when a negative pressure is supplied thereto and releases the component picked up through suction when the supply of the negative pressure thereto is stopped or a positive pressure is supplied thereto. Nozzle 37 protrudes downwards from a bottom surface of a main body of head 24. Additionally, a height of the component held with nozzle 37 through suction is adjusted by raising and lowering nozzle 37 along the Z-axis direction using Z-axis motor 34. An orientation of the component held with nozzle 37 through suction is adjusted by nozzle 37 being rotated accordingly by Q-axis motor 36.

Part camera 40 is disposed ahead of support plate 20 situated at a front side of board conveyance device 18. Part camera 40 has an imaging range situated above part camera 40 and images a component held by nozzle 37 from below, generating a captured image of the component. Part camera 40 includes irradiating section 41 and imaging section 49, as shown in FIG. 2.

Irradiating section 41 irradiates light onto an imaging target component. Irradiating section 41 includes housing 42, connecting section 43, incident light source 44, half-silvered mirror 46, and multi-stage light source 47. Housing 42 is a bowl-shaped member having an upper surface and a lower surface (a bottom surface) which are each opened into an octagonal shape. In housing 42, an opening in the upper surface is greater than an opening in the lower surface, and an interior space has a shape which tends to expand wider as it extends from the lower surface towards the upper surface. Connecting section 43 is a cylindrical member which connects housing 42 with imaging section 49. Incident light source 44 has multiple LEDs 45. Half-silvered mirror 46 reflects horizontal light emitted from LEDs 45 of incident light source 44 upwardly. Half-silvered mirror 46 transmits light coming from above towards imaging section 49. Multi-stage light source 47 includes upper-stage light source 47a, middle-stage light source 47b, and lower-stage light source 47c. Upper-stage light source 47a has multiple LEDs 48a, middle-stage light source 47b has multiple LEDs 48b, and lower-stage light source 47c has multiple LEDs 48c. LEDs 48a to 48c all emit light in inclined directions from optical axis 49a. In inclination angles of LEDs 48a to 48c from optical axis 49a, the inclination angle of LEDs 48a is the greatest, and LEDs 48a emit light almost in a horizontal direction. Additionally, the inclination angle of LEDs 48c is the smallest. Upper-stage light source 47a emits light almost in the horizontal direction and hence is referred to as a laterally light emitting light source, and middle-stage light source 47b emits light obliquely upwards and is hence referred to as an obliquely light emitting light source. In this embodiment, LEDs 48a of upper-stage light source 47a are blue LEDs, and LEDs 48b of middle-stage light source 47b, LEDs 48c of lower-stage light source 47c, and LEDs 45 of incident light source 44 are red LEDs.

Imaging section 49 generates a captured image of a component based on light it receives. Imaging section 49 includes an optical system made up, for example, of a lens and the like and an imaging device (for example, CCD), which are not shown. Light, which is emitted from incident light source 44 and multi-stage light source 47 and is then reflected by an imaging target component, passes through half-silvered mirror 46 to reach imaging section 49, whereupon imaging section 49 receives this light to generate a captured image of the imaging target component.

Reel unit 70 includes multiple reels 72 and is detachably mounted on a front side of mounting machine main body 14. A tape is wound around each reel 72. Multiple holding recessed sections are provided on a surface of the tape along a longitudinal direction of the tape. A component is held in each holding recessed section. Components held in these holding recessed sections are protected by a film which covers the surface of the tape. The tape is unwound towards the rear from the reel, and the film is removed from the tape at feeder section 74, whereby the components are exposed for pickup. The exposed components are then picked up by nozzle 37. The operation of reel unit 70 is controlled by feeder controller 76 (refer to FIG. 3).

As shown in FIG. 3, control device 60 includes CPU 61, storage section 63 (ROM, RAM, HDD, and the like), input and output interface 65, and the like, which are then connected to one another via bus 66. Control device 60 outputs drive signals to board conveyance device 18, drive motor 26*a* for X-axis slider 26, drive motor 30*a* for Y-axis slider 30, Z-axis motor 34, Q-axis motor 36, part camera 40, and a pressure supply source, not shown, for nozzle 37. A captured image is inputted into control device 60 from part camera 40. Controller device 60 is connected with feeder controller 76 of reel unit 70 for communication. Although not shown, a position sensor is fitted on each of sliders 26, 30, and control device 60 controls respective drive motors 26*a*, 30*a* of sliders 26, 30 while receiving positional information inputted thereinto from the position sensors.

Figure 4:
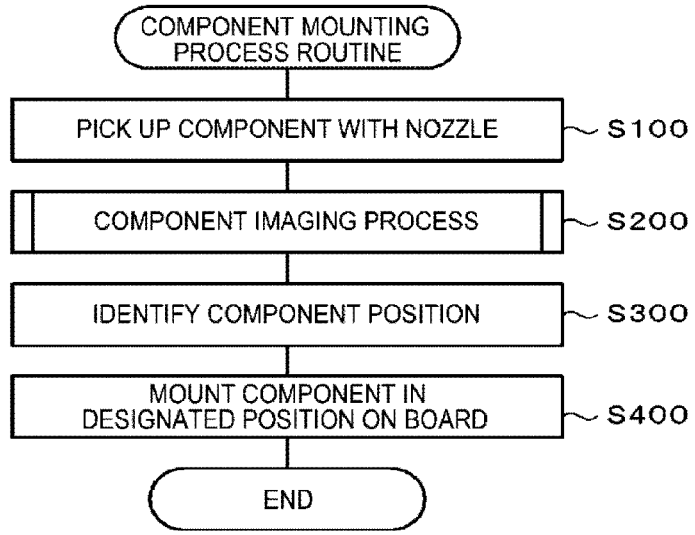
FIG. 4 is a flowchart of a component mounting process routine.

Next, the operation of component mounting machine 10 for a component mounting process will be described. CPU 61 of control device 60 controls various sections of component mounting machine 10 based on a production job received from a management computer, not shown, to fabricate boards 16 on which multiple components are mounted. The production job is information dictating which components are mounted on board 16 in which order and the number of boards 16 on which components are mounted in component mounting machine 10. FIG. 4 is a flowchart of a component mounting process routine. Firstly, CPU 61 causes nozzle 37 to pick up a component through suction (S100). Specifically, CPU 61 controls the sections involved, causing nozzle 37 to face a component fed out to a predetermined component supply position by reel unit 70 and supplies a negative pressure to nozzle 37 so that the component now situated in the component supply position is picked up through suction by nozzle 37. Following this, CPU 61 then executes a component imaging process (S200). Specifically, CPU 61 moves the component, which is picked up by and held with nozzle 37 through suction, to an imaging range defined above part camera 40, causing part camera 40 to image the component. Details of this component imaging process will be described later. Following this, CPU 61 identifies a position of the component with respect to the center of nozzle 37 from an image of the component so obtained (S300). Following this, CPU 61 mounts the component picked up by and held with nozzle 37 through suction onto board 16 (S400). Specifically, CPU 61 controls the sections involved while taking the position of the component with respect to the center of nozzle 37 into consideration so that the component is disposed directly above a designated position on board 16 and then supply a positive pressure to nozzle 37, causing nozzle 37 to release the component held thereto in the position. CPU 61 repeatedly executes the component mounting process to thereby mount predetermined numbers and types of components on board 16.

Figure 5:
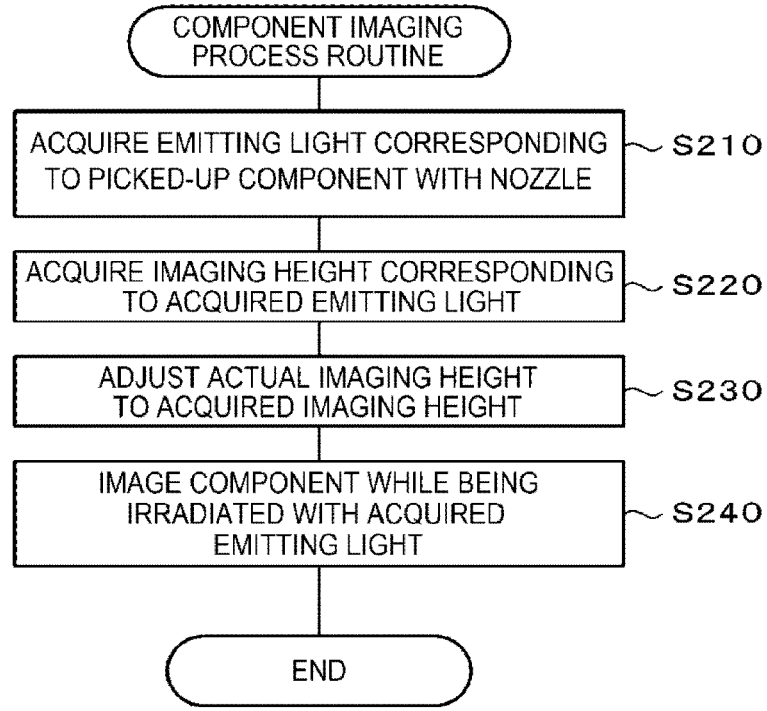
FIG. 5 is a flowchart of a component imaging process routine.
Figure 6:
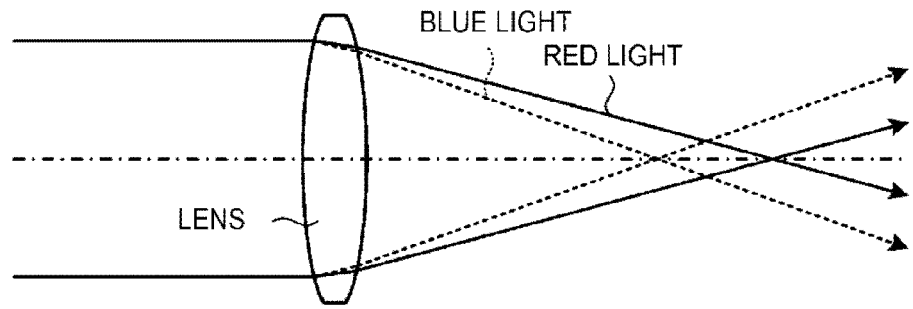
FIG. 6 is an explanatory diagram of a longitudinal chromatic aberration.
Figure 7:
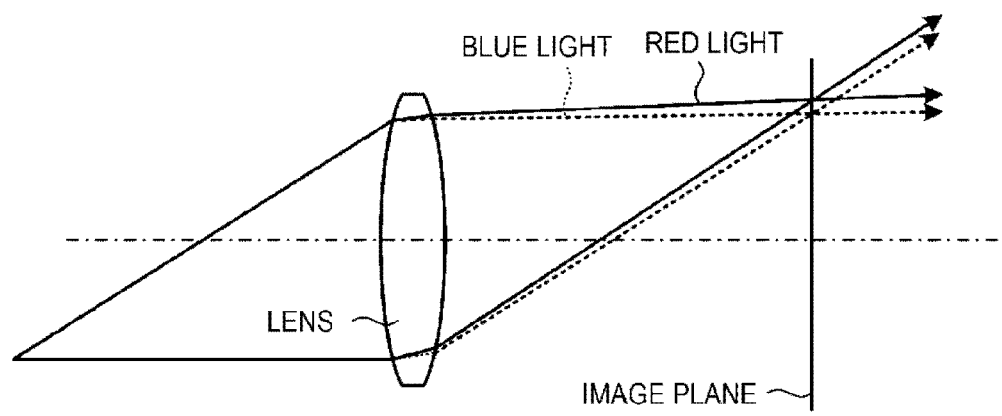
FIG. 7 is an explanatory diagram of a chromatic aberration of magnification.

Next, a subroutine of the component imaging process in S200 described above will be described. FIG. 5 is a flowchart of a component imaging process. Firstly, a chromatic aberration will be described before describing the subroutine. There are two types of chromatic aberrations, which are a longitudinal chromatic aberration and a chromatic aberration of magnification. The longitudinal chromatic aberration means a phenomenon in which lights which are parallel to an optical axis form corresponding images at different image forming points on the optical axis due to different refractive indexes resulting from different wavelengths. Specifically, as shown in FIG. 6, blue light forms an image at a point nearer to a lens while red light forms an image at a point farther from the lens on an optical axis. On the other hand, the chromatic aberration of magnification means a phenomenon in which lights incident obliquely on an optical axis form corresponding images in different positions on an image plane, whereby a color deviation tends to occur more at a radially outer circumferential portion of the image. Specifically, as shown in FIG. 7, although focal distances of blue light and red light are the same, focal points thereof are situated at different points on the image plane from a center line of a lens. The effect of the chromatic aberrations can be solved by a lens design; however, in this embodiment, the effect of the chromatic aberrations is configured to be solved not by the lens design but by adjusting a height of a captured image of each emitting light or switching resolving powers for image processing by a calibration measurement, as will be described later.

A table (Table 1) is stored in advance in storage section 63, the table representing a correlation between emitting lights and proper imaging height values. An image forming point on the optical axis can be calculated in a lens designing stage based on a lens used in imaging section 49 and a wavelength of an emitting light irradiated from irradiating section 41. As a result, a proper imaging height value for a specific emitting light can be obtained in advance. In this embodiment, red light, blue light, or a combination of red light and blue light is used as emitting light. An imaging height of a component is any height from an upper end face of part camera 40 to a distal end face of nozzle 37, and a proper imaging height value for the blue light is set at H1, a proper imaging height value for the red light is set at H2, and a proper imaging height value for the combination of red light and blue light is set at H3 (H2>H3>H1). An emitting condition for using the blue light as the emitting light is to emit only blue LEDs 48*a*, an emitting condition for using the red light as the emitting light is to emit only red LEDs 45, 48*b*, 48*c*, and an emitting condition for using both the blue light and the red light as the emitting light is to emit all LEDs 45, 48*a* to 48*c* together.

TABLE 1

| EMITTING LIGHT | PROPER IMAGING HEIGHT VALUE |
|---|---|
| BLUE LIGHT | H1 |
| RED LIGHT | H2 |
| BLUE LIGHT AND RED LIGHT | H3 |

When starting the component imaging process shown in FIG. 5, CPU 61 firstly reads out and acquires the emitting light corresponding to a component picked up by and held with the nozzle through suction from a table (refer to Table 2) stored in storage section 63, the table representing a correlation between components and the emitting lights (S210).

TABLE 2

| COMPONENT | EMITTING LIGHT |
| --- | --- |
| COMPONENT Pa | BLUE LIGHT |
| COMPONENT Pb | RED LIGHT |
| COMPONENT Pc | BLUE LIGHT AND RED LIGHT |
| . | . |
| . | . |
| . | . |

Figure 8:
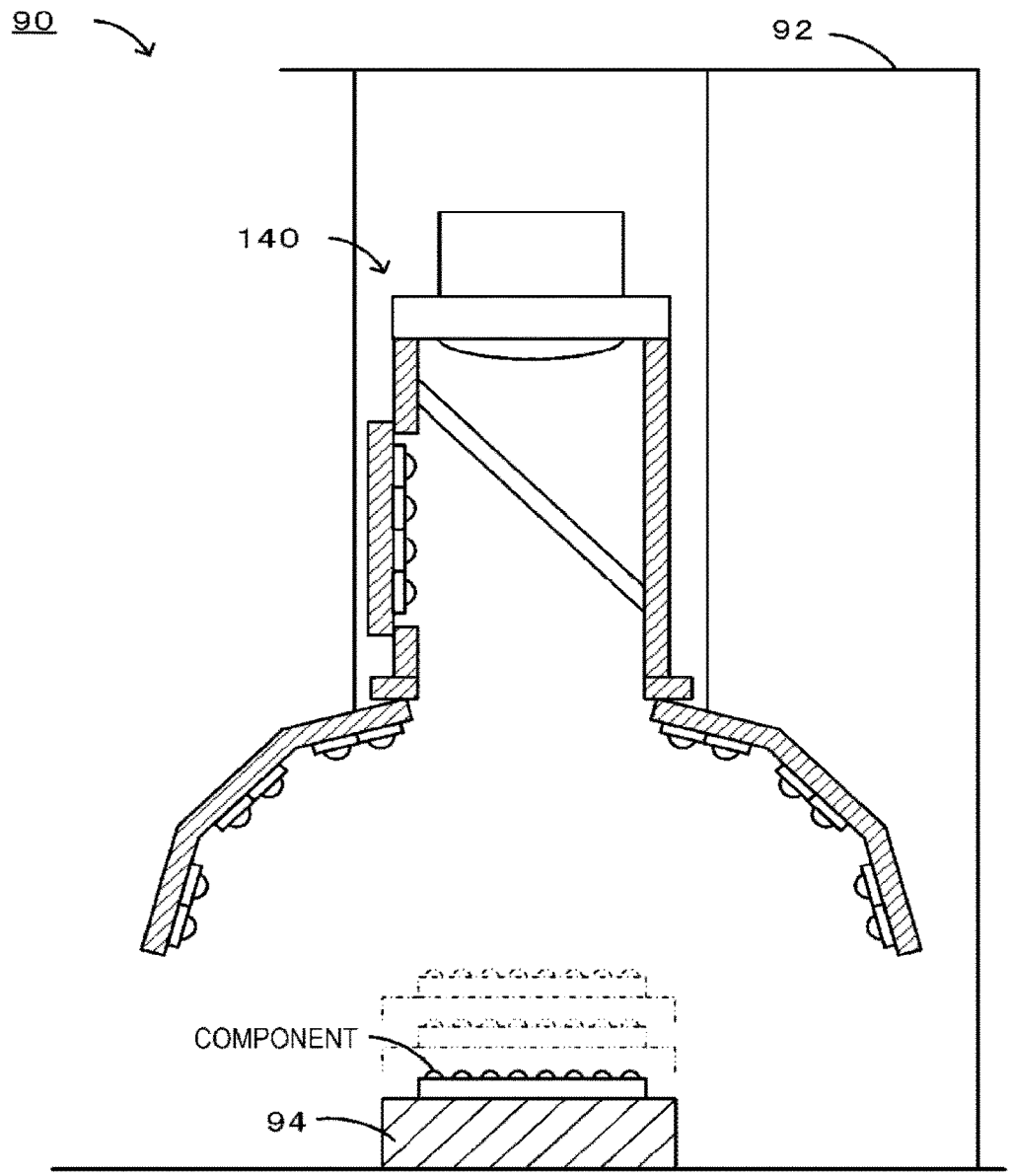
FIG. 8 is a schematic explanatory diagram of the configuration of off-line imaging machine 90.

This table summarizes the results of setting in advance the emitting lights for individual components using off-line imaging machine 90 shown in FIG. 8. Off-line imaging machine 90 is such that test camera 140, which is the same camera as part camera 40, is attached to stand 92 in such a manner that an imaging range thereof is directed downwards and component resting plate 94 is provided below test camera 140 in such a manner as to move upwards or downwards towards or from test camera 140. The emitting lights are set individually for components for use in a production job using off-line imaging machine 90. Specifically, at first, one component is placed on component resting plate 94, and the component is imaged sequentially by light of three colors, that is, the blue light, the red light, and both the blue light and the red light. At this time, a distance between an upper surface of component resting plate 94 and a lower end face of test camera 140 is made to coincide with the proper imaging height values corresponding the emitting lights (refer to Table 1). A predetermined image processing program by the computer is performed on obtained images to determine whether an image processing error occurs in the obtained images, and if no image processing error occurs in the specific emitting light used, the specific emitting light is stored in association with the relevant component in storage section 63. If an image processing error occurs in all the emitting lights, the proper emitting light, which eventually causes no image processing error, for the component is found out by changing set values for the image processing program. Instead of identifying the presence of an image processing error by the computer, a visual inspection for the presence of an image processing error by the operator may be adopted.

Figure 9:
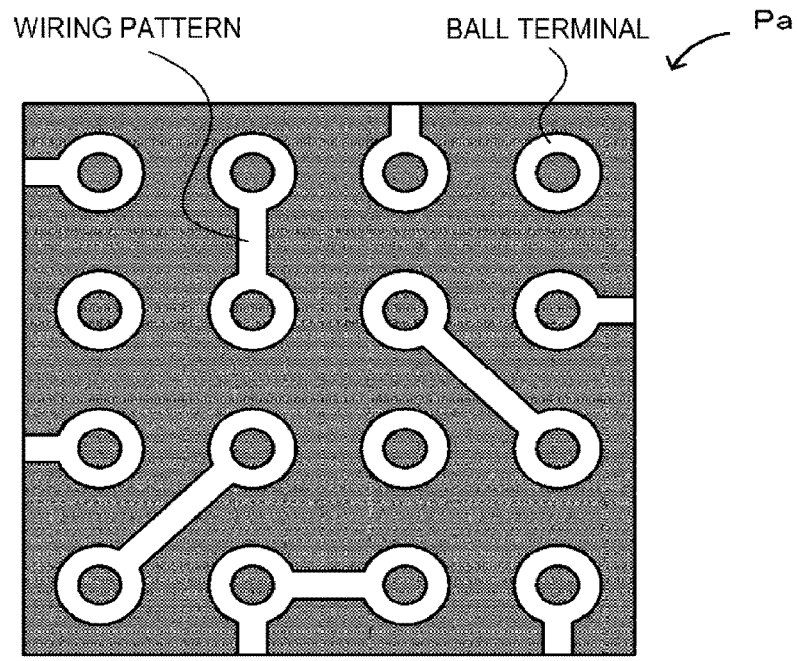
FIG. 9 is an explanatory diagram of an image captured by irradiating component Pa with red light.
Figure 10:
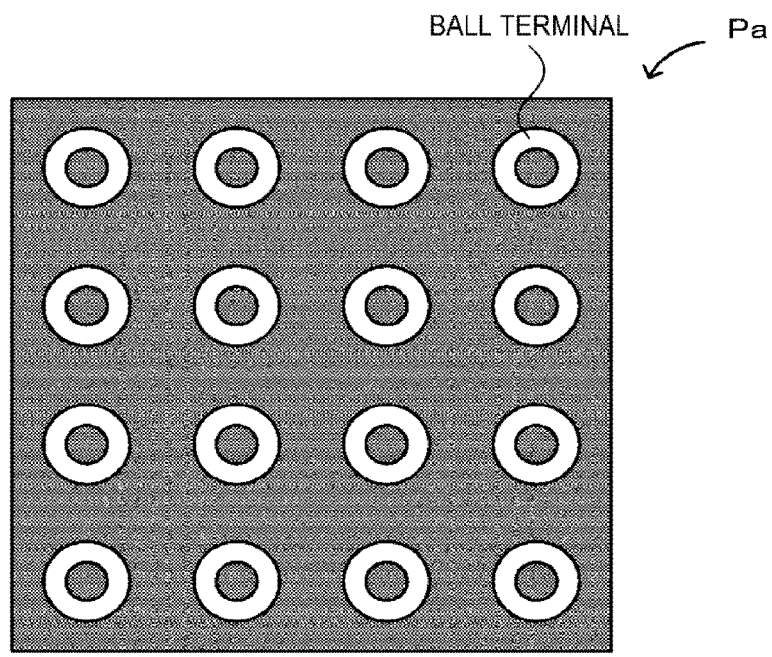
FIG. 10 is an explanatory diagram of an image captured by irradiating component Pa with blue light.

For example, component Pa is a BGA package in which multiple ball terminals are formed into a lattice configuration and copper wiring patterns are formed on a lower surface of a main body thereof. In imaging the ball terminals of component Pa, when the ball terminals are irradiated with the red light for imaging, not only the ball terminals but also the wiring patterns are captured, resulting in the occurrence of an image processing error (refer to FIG. 9). However, imaging component Pa by irradiating it with the blue light can avoid capturing the wiring patterns together with the ball terminals, which turns out avoiding the occurrence of image processing error (FIG. 10). Thus, the blue light is set for component Pa as the proper irradiating light therefor. When imaging the ball terminals of the BAG package like component Pa, the blue light is desirably irradiated only from the laterally light emitting light source. Annular bright rings denote the ball terminals in FIGS. 9 and 10. Component Pb is an LGA package (with no copper wiring pattern) in which planar electrodes are embedded in a bottom surface of a main body thereof, and the red light is set as the emitting light for component Pb. Component Pc is a small out line package (SOP) in which multiple leads are formed on both side surfaces of a main body thereof, and both the blue light and the red light are set as the emitting light for component Pc.

Next, CPU 61 acquires the proper imaging height value for the emitting light acquired this time (S220). Specifically, CPU 61 reads out and acquires the proper value for the imaging height corresponding to the emitting light acquired this time from the table (refer to Table 1) stored in storage section 63, the table representing the correspondence relationship between the emitting lights and the proper values for the imaging heights of the components.

Subsequently, CPU 61 controls the Z-axis motor so that the imaging height coincides with the proper value for the imaging height acquired this time (S230) and images the component using part camera 40 while causing the irradiating section to emit the component with the emitting light acquired this time (S240). An image captured by part camera 40 is stored in storage section 63. Since the image is such as to be captured at the imaging height which coincides with the proper value for the imaging height corresponding to the emitting light used, the effect of the longitudinal chromatic aberration is suppressed, resulting in a clear image. Thus, the position of the component with respect to the center of nozzle 37 can be obtained with high accuracy by processing the clear image.

Next will be described a method for setting a resolving power proper value for image processing performed when CPU 61 identifies the position of the component with respect to the center of nozzle 37 in S300 described above. Firstly, CPU 61 executes a calibration for correcting the chromatic aberration of magnification. CPU 61 executes this calibration using off-line imaging machine 90 described above. For example, the operator rests a resolving power measuring sheet on component resting plate 94. Two measuring points are provided on the resolving power measuring sheet, and a distance between the two points is known. The resolving power measuring sheet is irradiated by any one of the three emitting lights, and the resolving power measuring sheet so irradiated is imaged by test camera 140, whereby a distance between the two measuring points on an image obtained then is calculated. A total number of pixels between the two points is known in advance. As a result, a resolving power proper value for the emitting light irradiated onto the resolving power measuring sheet is obtained by dividing the calculated distance between the two points by the total number of pixels. In executing the calibration, the distance between the upper surface of the component resting plate 94 and the lower end face of test camera 140 is made to coincide with the proper value for the imaging height for the relevant emitting light (refer to Table 1).

Table 3 shows an example of resolving power proper values for the emitting lights obtained by executing the calibration described above. Table 3 is stored in storage section 63 as a table representing a correspondence relationship between the emitting lights and corresponding resolving power proper values. In image processing an image of a component imaged by part camera 40 of component mounting machine 10, CPU 61 of control device 60 uses a resolving power proper value corresponding to the emitting light used to emit the component for capturing an image of the component. CPU 61 identifies a position of the component with respect to the center of nozzles 37 from the captured image of the component in S300. The position of the center of nozzle 37 in the image is known. Theoretically, the center of nozzle 37 ought to coincide with a predetermined pickup position of a component (normally, the center of a component). However, due to a deviation of the supply position of a component, the component is picked up with the center of nozzle 37 deviating from the predetermined pickup position of the component. CPU 61 recognizes a deviation amount between the predetermined pickup position of the component and the center of nozzle 37 in S300. Then, taking the recognized deviation amount into consideration, CPU 61 causes drive motors 26*a*, 30*a* to dispose the component directly above the designated position on board 16. Here, the resolving power of the image captured by part camera 40 differs depending upon the emitting light used. Specifically, an actual distance corresponding to one pixel differs depending upon the emitting light used. As a result, CPU 61 controls drive motors 26*a*, 30*a* by converting the deviation amount of the predetermined pickup position of the component from the center of nozzle 37, which CPU 61 recognizes in S300, into an actual distance by use of the proper resolving power value corresponding to the used irradiating light shown in Table 3. Therefore, in S400, CPU 61 can mount the component on the board by using a highly accurate deviation amount correction value in which the effect of chromatic aberration of magnification is suppressed.

TABLE 3

| EMITTING LIGHT | PROPER RESOLVING POWER VALUE [µm/pixel] |
|---|---|
| BLUE LIGHT | 23.05 |
| RED LIGHT | 24.05 |
| BLUE LIGHT AND RED LIGHT | 24.00 |

Hereafter will be described a correlation between the constituent elements of the embodiment and constituent elements of an imaging unit according to the disclosure. Imaging section 49 of the embodiment corresponds to an imaging unit of the disclosure, nozzle 37 to a holding member, irradiating section 41 to a light irradiation device, and control device 60 to a control device. Further, Z-axis motor 34 and ball screw 35 correspond to a distance adjusting device, and the imaging height to a distance between the camera and the holding member.

In the embodiment that has been described heretofore, one or more light sources selected from the multiple light sources configured to emit lights of difference wavelengths (upper stage light source 47*a*, middle stage light source 47*b*, lower stage light source 47*c*, and incident light source 44) are used for imaging a component, and the proper resolving power value is obtained which corresponds to the light or lights of the one or more light sources selected for imaging. Then, the light or lights of the one or more light sources so selected are irradiated onto the component held to nozzle 37 to image the component using imaging section 49, and the proper resolving power value obtained previously is used for processing an image obtained from imaging section 49. The proper resolving power values differ depending upon the light or lights of the one or more light sources selected from the multiple light sources that emit the lights of different wavelengths (that is, the wavelengths of the emitting lights used) due to the effect of chromatic aberration of magnification. In this embodiment, in processing the image of the component obtained from imaging section 49, the image is processed by making use of the proper resolving power value corresponding to the wavelength of the emitting light used to emit the component. Therefore, the effect of the chromatic aberration of magnification can be suppressed when processing the captured image of the component.

In addition, CPU 61 reads out the proper resolving power value for the emitting light used for imaging the component from storage section 63 and makes use of the proper resolving power value so read out for processing the captured image of the component. Therefore, the proper resolving power value does not have to be obtained each time by performing the calibration measurement or the like.

Further, the imaging height is made to become the proper imaging height value obtained based on the image forming point on the optical axis which changes according to the longitudinal chromatic aberration before imaging the component held with nozzle 37 through suction using imaging section 49 of part camera 40. As a result, the effect of the longitudinal chromatic aberration can also be suppressed when processing the captured image of the component.

Furthermore, since the proper imaging height value is read out from storage section 63, so that the actual imaging height is caused to become the proper imaging height value, the proper imaging height value does not have to be obtained each time by performing the calibration measurement or the like.

The present disclosure is not limited in any way to the embodiment that has been described heretofore, and needless to say, the disclosure can be carried out in various forms without departing from the technical scope of the disclosure.

For example, in the embodiment described above, the three types of light such as the blue light, the red light, and the combination of the blue light and the red light are described as being used as the emitting lights: however, the disclosure is not particularly limited thereto, and hence, in place of or in addition to these emitting lights, other emitting lights (for example, green light, UV light, IR light, and the like) may be used.

In the embodiment described above, the resolving power measuring sheet is used to measure a resolving power; however, the disclosure is not particularly limited thereto, and hence, a resolving power may be obtained by using, for example, a sheet or an instrument on which dots are aligned at constant intervals and measuring a length of the interval on an captured image.

In the embodiment described above, part camera 40 is described as being the constituent element of the imaging unit of the disclosure; however, the disclosure is not particularly limited thereto, and hence, any type of camera may be used, as long as the camera includes a multicolor irradiating device in which no countermeasure against chromatic aberration is provided on a lens side.

In the embodiment described above, nozzle 37 is described as being the holding member of the imaging unit of the disclosure; however, the disclosure is not particularly limited thereto, and hence, for example, a mechanical chuck or an electromagnet may be used as the holding member.

In the embodiment described above, reel unit 70 is described as being the component supply device; however, the disclosure is not particularly limited thereto, and hence, for example, a tray unit may be adopted. The tray unit being configured to supply components rested on a tray.

In the embodiment described above, the imaging height is described as being any height from the upper end face of part camera 40 and the distal end face of nozzle 37; however the disclosure is not particularly limited thereto, and hence, the upper end face of imaging section 49 may be used in place of the upper end face of part camera 40, or a lower surface of a component picked up by and held with nozzle 37 through suction may be used in place of the distal end face of nozzle 37.

The imaging unit of the disclosure or another imaging unit of the disclosure may be configured as follows.

The imaging unit according to the disclosure may adopt a configuration in which the imaging unit includes a storage device configured to store a relationship between the one or more light sources selected from the multiple light sources and the proper resolving power value, and, in making use of the proper resolving power value, the control device reads out the proper resolving power value for the one or more light sources selected from the multiple light sources for use for imaging from the storage device for use. As a result, the proper resolving power value for the emitting light used for imaging does not have to be obtained each time by performing the calibration measurement or the like.

The imaging unit according to the disclosure may adopt a configuration in which the imaging unit includes a distance adjusting device configured to adjust a distance between the camera and the holding member, and the control device obtains a proper value for the distance for the light or lights of the one or more light sources selected from the multiple light sources for use for imaging based on an image forming point on an optical axis which changes according to a longitudinal chromatic aberration, controls the distance adjusting device so that the actual distance becomes the proper value for the distance, thereafter, irradiates the light or lights of the selected one or more light sources onto the imaging target object held by the holding member to image the imaging target object using the camera, and makes use of the proper resolving power value in processing an image obtained from the camera. As a result, since the distance between the camera and the holding member is made to become the proper distance value obtained based on the image forming point on the optical axis which changes according to the longitudinal chromatic aberration before the imaging target object is imaged by the camera, the effect of the longitudinal chromatic aberration can be suppressed when processing the captured image of the imaging target object.

Another imaging unit according to the disclosure may adopt a configuration in which the imaging unit includes a storage device configured to store a relationship between the one or more light sources selected from the multiple light sources and the proper value for the distance, and the control device reads out the proper value for the distance for the light or lights of the one or more light sources selected from the multiple light sources for use for imaging from the storage device and controls the distance adjusting device so that the actual distance becomes the proper value for the distance. As a result, the proper value for the distance for the light or lights of the one or more light sources for use for imaging does not have to be obtained each time by performing the calibration measurement or the like, the distance being defined between the camera and the holding member.

In either of the imaging units according to the disclosure described above, the multiple light sources may be configured to include at least the blue light source and the red light source. For example, with the wiring patterns for the ball terminal components being formed of copper, although the wiring patterns are also captured in the captured image together with the ball terminals when the ball terminals are imaged while being irradiated by the red light source, capturing the wiring patterns in the captured image can be suppressed when the ball terminals are imaged while being irradiated by the blue light source. On the other hand, in the case of a component including terminals embedded in a plane thereof and having no wiring pattern, the embedded terminals are preferably imaged while being irradiated by the red light source.

The component mounting machine of the disclosure includes either of the imaging units described above. In the component mounting machine, for example, the component supplied to the component supply position is picked up and held by the holding member, the component is then carried to the component mounting position, and the component is released from the holding member which has held it until then, whereby the component is eventually mounted in the component mounting position. In this case, the component constitutes the imaging target object. Since the component mounting machine according to the disclosure includes either of the imaging units described above, an advantageous effect can be obtained which is similar to that obtained with either of the imaging units described above.

INDUSTRIAL APPLICABILITY

The present disclosure can be applied to an industry involving the operation of imaging a component held by a holding member.

REFERENCE SIGNS LIST

10 Component mounting machine, 12 Loading base, 14 Mounting machine main body, 16 Board, 18 Board conveyance device, 20 Support plate, 22 Conveyor belt, 23 Support pin, 24 Head, 26 X-axis slider, 26a Drive motor, 28 Guide rail, 30 Y-axis slider, 30a Drive motor, 32 Guide rail, 34 Z-axis motor, 35 Ball screw, 36 Q-axis motor, 37 Nozzle, 40 Part camera, 41 Irradiating section, 42 Housing, 43 Connecting section, 44 Incident light source, 45 LED, 46 Half-silvered mirror, 47 Multistage light source, 47a Upper stage light source, 47b Middle stage light source, 47c Lower stage light source, 48a-48c LED, 49 Imaging section, 49a Optical axis, 60 Control device, 61 CPU, 63 Storage section, 65 Input and output interface, 66 Bus, 70 Reel unit, 72 Reel, 74 Feeder section, 76 Feeder controller, 90 Off-line imaging machine, 92 Stand, 94 Component resting plate, 140 Test camera.

The invention claimed is:
1. An imaging unit comprising:
a camera;
a holding member configured to hold an imaging target object to be imaged by the camera;
a light irradiation device configured to irradiate lights of different wavelengths from multiple light sources towards the imaging target object held by the holding member; and
a control device configured to
obtain a proper resolving power value for a light or lights of one or more light sources selected from the multiple light sources for use for imaging, by irradiating the light or lights of the one or more light sources on a calibration object with a known number of pixels between points and determining a measured distance between the points using the camera, the proper resolving power value obtained by dividing the known number of pixels by the measured distance, and
and make use of the proper resolving power value in processing an image obtained from the camera.

2. The imaging unit according to claim 1, comprising:
a storage device configured to store relationships between the one or more light sources selected from the multiple light sources and the proper resolving power value,
wherein in making use of the proper resolving power value, the control device reads out the proper resolving power value for the one or more light sources selected from the multiple light sources for use for imaging from the storage device for use.

3. The imaging unit according to claim 1, comprising:
a distance adjusting device configured to adjust a distance between the camera and the holding member,
wherein the control device obtains a proper value for the distance for the light or lights of the one or more light sources selected from the multiple light sources for use for imaging based on an image forming point on an optical axis which changes according to a longitudinal chromatic aberration, controls the distance adjusting device so that the actual distance becomes the proper value for the distance, thereafter, irradiates the light or lights of the selected one or more light sources onto the imaging target object held by the holding member to image the imaging target object using the camera, and makes use of the proper resolving power value in processing the image obtained from the camera.

4. The imaging unit according to claim 1, wherein the multiple light sources comprises at least a blue light source and a red light source.

5. A component mounting machine comprising the imaging unit according to claim 1.

* * * * *